United States Patent
Shih et al.

[19]

[11] Patent Number: 6,132,265
[45] Date of Patent: Oct. 17, 2000

[54] BATTERY CONNECTOR

[75] Inventors: Kelly Shih; Allen Chiu, both of Tu-Chen, Taiwan

[73] Assignee: Hon Hai Precision Ind. Co., Ltd., Taipei Hsien, Taiwan

[21] Appl. No.: 09/369,235

[22] Filed: Aug. 5, 1999

[30] Foreign Application Priority Data

Apr. 16, 1999 [TW] Taiwan ................................ 88205877

[51] Int. Cl.$^7$ ..................................................... H01R 9/24
[52] U.S. Cl. ........................................... 439/885; 439/500
[58] Field of Search .................................... 439/885, 500

[56] References Cited

U.S. PATENT DOCUMENTS

| | | | |
|---|---|---|---|
| 5,145,383 | 9/1992 | Bowen et al. ........................... | 439/885 |
| 5,152,700 | 10/1992 | Bogursky et al. ...................... | 439/885 |
| 5,376,026 | 12/1994 | Ohashi .................................... | 439/885 |
| 5,772,472 | 6/1998 | Beutler et al. .......................... | 439/608 |
| 5,795,181 | 8/1998 | Davis ...................................... | 439/500 |

*Primary Examiner*—Gary F. Paumen
*Attorney, Agent, or Firm*—Wei Te Chung

[57] ABSTRACT

A battery connector comprises a dielectric housing defining a number of passageways, and a number of terminals received in the corresponding passageways. Each terminal comprises a blade-like mating portion having a lateral edge portion for electrically contacting a corresponding battery coil and a connecting leg outwardly extending from a free end of the lateral edge portion of the mating portion for connecting with a circuit board. The mating portion of each terminal defines a cutout in a corner recessed in the other free end of the lateral edge portion and opposite the connecting leg for extension of a connecting leg of an adjacent terminal when the terminals are connected to a terminal carrier strip.

3 Claims, 6 Drawing Sheets

BATTERY CONNECTOR

BACKGROUND OF THE INVENTION

The present invention relates to a battery connector, and particularly to a battery connector having terminals with adjustable terminal for facilitating cost-effect production with minimum material thereby decreasing manufacturing costs.

Battery connectors are widely used in notebook computers for providing electrical energy power. Conventional battery connectors are disclosed in U.S. Pat. Nos. 5,772,472 and 5,795,181, as well as in Taiwan Patent Application Nos. 84111321 and 85104675.

Referring to FIG. 1, a conventional battery connector 6 comprises a dielectric housing 61 defining a plurality of passageways 611 therein, a plurality of terminals 62 received in the corresponding passageways 611, and a pair of retention members 63 for fixing the battery connector 6 to a circuit board (not shown). Each terminal 62 comprises a mating portion 621 for electrically contacting with corresponding battery electrode (not shown), and a connecting leg 622.

Referring also to FIG. 2, the terminals 62 are connected by a carrier strip 620 when being stamped and formed. A single terminal 62 has a total length (a length of the mating portion 621 plus a length of the connecting leg 622, or a length measured from a tip of the mating portion 621 to an end of the connecting leg 622) equal to distance T1. As is well known, the connecting leg 622 is inserted into a through hole of the circuit board and soldered by wave soldering process. The thickness of different circuit board may vary from one another, while the length of the terminal remains unchanged, this may raise a problem if the effective engagement between the leg and the hole it too short to ensure a reliable connection therebetween.

However, in order to achieve a proper length of the connecting legs 622 corresponding to circuit boards of different thickness, the conventional terminals 62 must be modified according different print circuit board. Since adjacent terminals 62 are spaced from each other, the connecting legs 622 of one terminal 62 extend a first distance T1' and can only further extend a limited distance T2' along a direction parallel to the carrier strip 620. Therefore, a new die is required to provide terminals having connection ends of increased length. Furthermore, such terminals formed by the new die are connected by a carrier strip and spaced from each other a new distance different from the original distance. Thus, the reformation of an apparatus for separating the carrier strip from the terminals or other apparatuses used in assembly is required. However, such alterations complicate the manufacturing process and increase costs.

BRIEF SUMMARY OF THE INVENTION

A main object of the present invention is to provide a battery connector having adjustable terminals with connecting legs for adapting to connect with circuit boards of different thickness.

Another object of the present invention is to provide a battery connector having adjustable terminals which conserve metal sheet material thereby reducing manufacture costs.

A battery connector in accordance with the present invention comprises a dielectric housing and a plurality of adjustable terminals received in the housing. Each adjustable terminal comprises a mating portion and a connecting leg perpendicularly extending from one edge portion of the mating portion. A cutout is defined in an edge portion of the mating portion proximate the connecting leg.

Before the terminals are separated from a carrier strip, the terminals and the carrier strip make up a subassembly. The terminals are arranged in a common plane whereby adjacent terminals are disposed with the connecting leg of one terminal extending partially into the cutout of an adjacent terminal. Thus, the connecting leg of each terminal is provided with an adjustable length which is adaptable to connect with circuit boards of different thickness since the connecting legs can be formed to have a length substantially equal to or longer than a required length. If the connecting legs are longer than the required length, an excess length of each connecting leg can be conveniently severed off. In addition, because the subassembly can be stamped and formed without changing the distance between adjacent terminals, and due to the arrangement of the cutouts of the terminals, the present invention conserves material for forming the terminals thereby reducing costs.

Other objects, advantages and novel features of the invention will become more apparent from the following detailed description when taken in conjunction with the accompanying drawings.

DETAILED DESCRIPTION OF THE INVENTION

Figure 3:
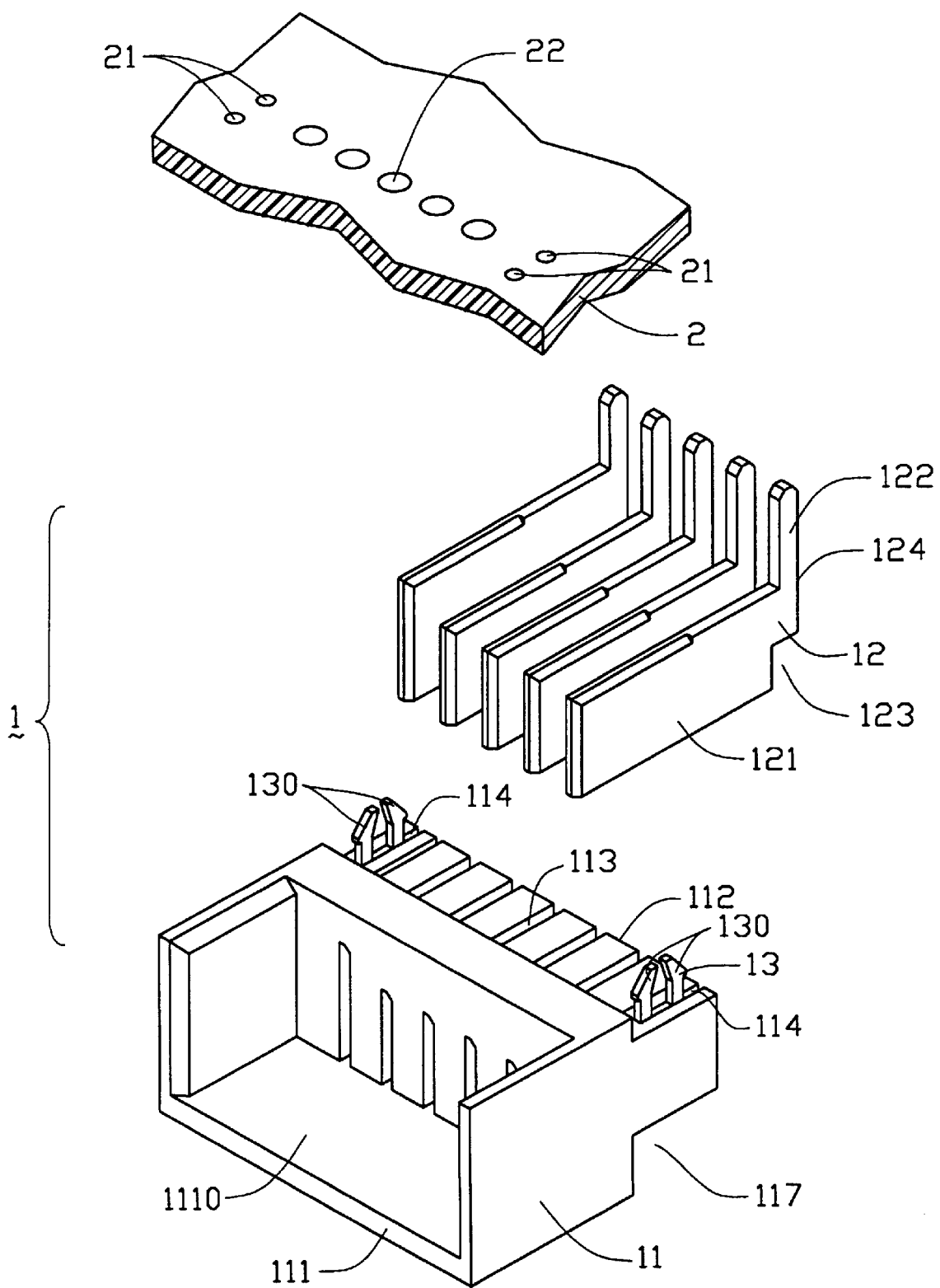
FIG. 3 is an exploded view of a battery connector in accordance with the present invention and a circuit board.

Referring to FIG. 3, a battery connector in accordance with the present invention comprises a dielectric housing 11, a plurality of terminals 12 received in the housing 11, and a pair of retention members 13 mounted in the housing 11 for retaining the battery connector on a circuit board 2.

The housing 11 comprises a mating portion 111 defining a receiving chamber 1110 for insertion of a mating connector (not shown) and a joining portion 112. The joining portion 112 define a plurality of passageways 113 for receiving the corresponding terminals 12 therein, and a pair of latching slots 114 at opposite ends thereof for receiving the corresponding retention members 13 therein. Each retention member 13 has a pair of lugs 130 outwardly extending beyond the housing 11 for engaging with corresponding holes 21 defined in the circuit board 2.

Figure 4:
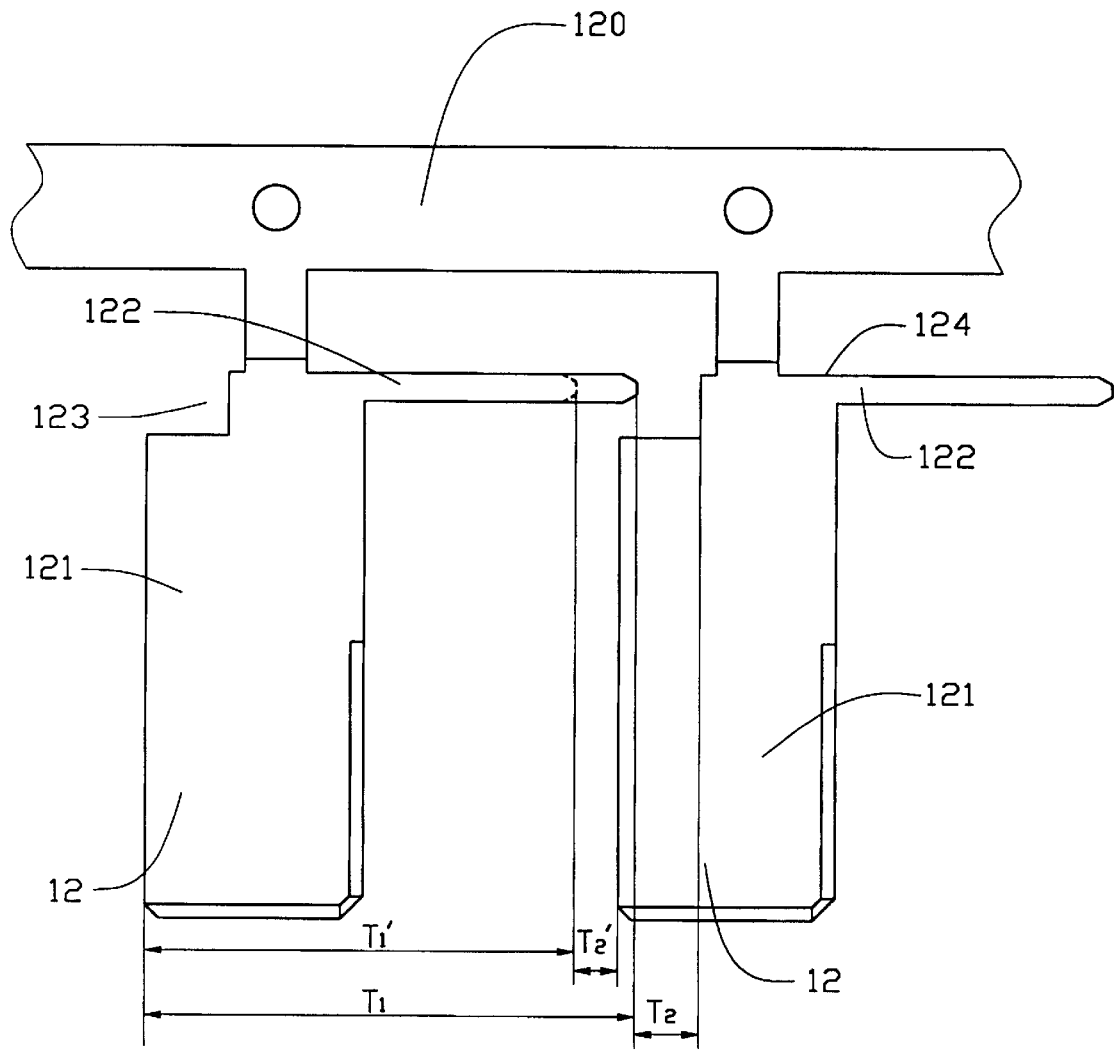
FIG. 4 is a plan view showing terminals of FIG. 3 connected to a carrier strip.

Referring further to FIG. 4, a subassembly 3 comprises a carrier strip 120 and the terminals 12 outwardly extending from the carrier strip 120. The terminals 12 are arranged side by side in a common plane.

Each terminal 12 comprises a blade-like mating portion 121 having a lateral edge portion 124 for electrically contacting a corresponding battery coil (not shown) and a connecting leg 122 outwardly extending from a free end of the lateral edge portion 124 of the mating portion 121 for engaging with a corresponding aperture 22 defined in the circuit board 2. The mating portion 121 of each terminal 12 and defines a cutout 123 in a recessed corner in the other free end of the lateral edge portion 124 and opposite the connecting leg 122. The cutout 123 should be arranged whereby mechanical and electrical performance of the terminals 12 is not hindered. In a preferred embodiment, each cutout 123 is defined in the mating portion 121 with a length extending along a first direction parallel to and substantially equal to one third of a width of the mating portion 121, and a width extending along a second direction perpendicular to the first direction and substantially equal to one ninth of a length of the mating portion 121. The cutout 123 is dimensioned to allow insertion of the connecting portion 122 of an adjacent terminal 12 and insertion of a corresponding punch pin of a die (not shown) for stamping and forming the subassembly 3.

Figure 1:
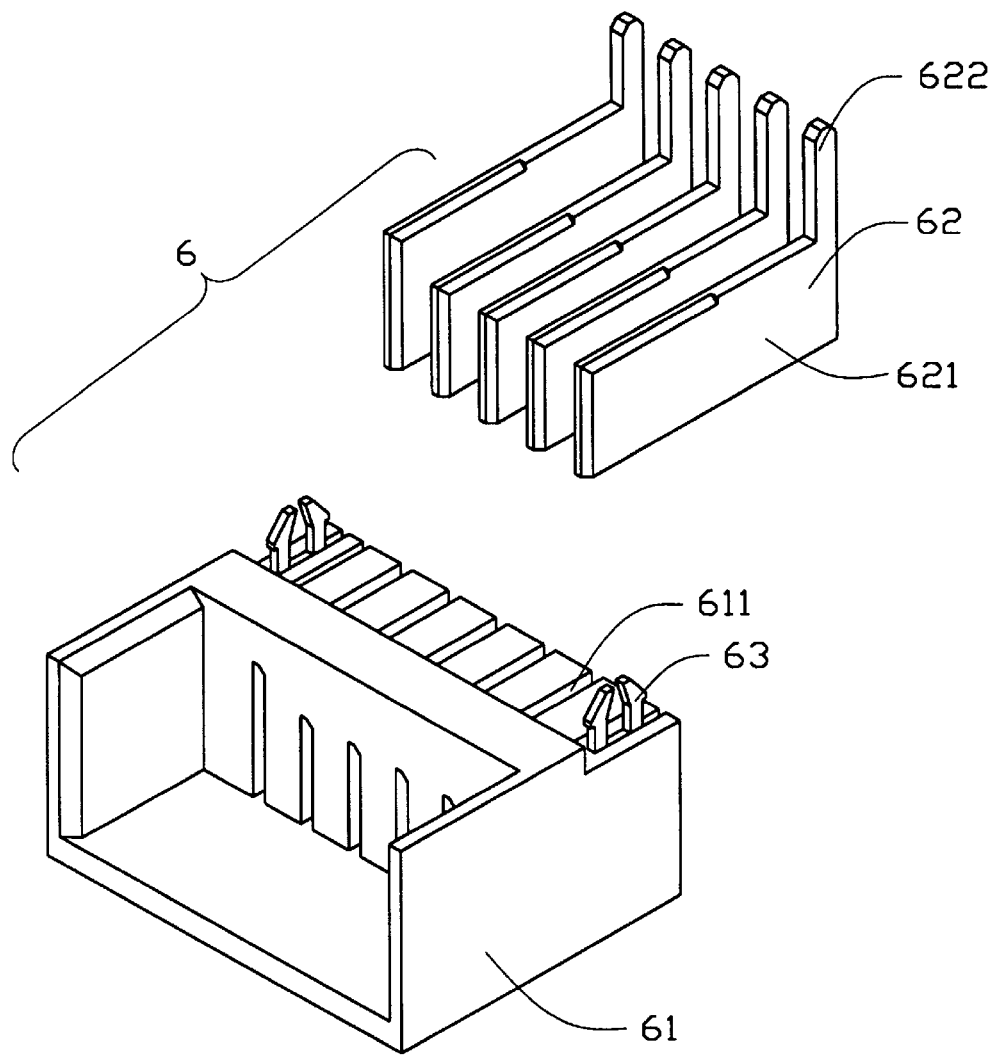
FIG. 1 is an exploded view of a conventional battery connector.
Figure 2:
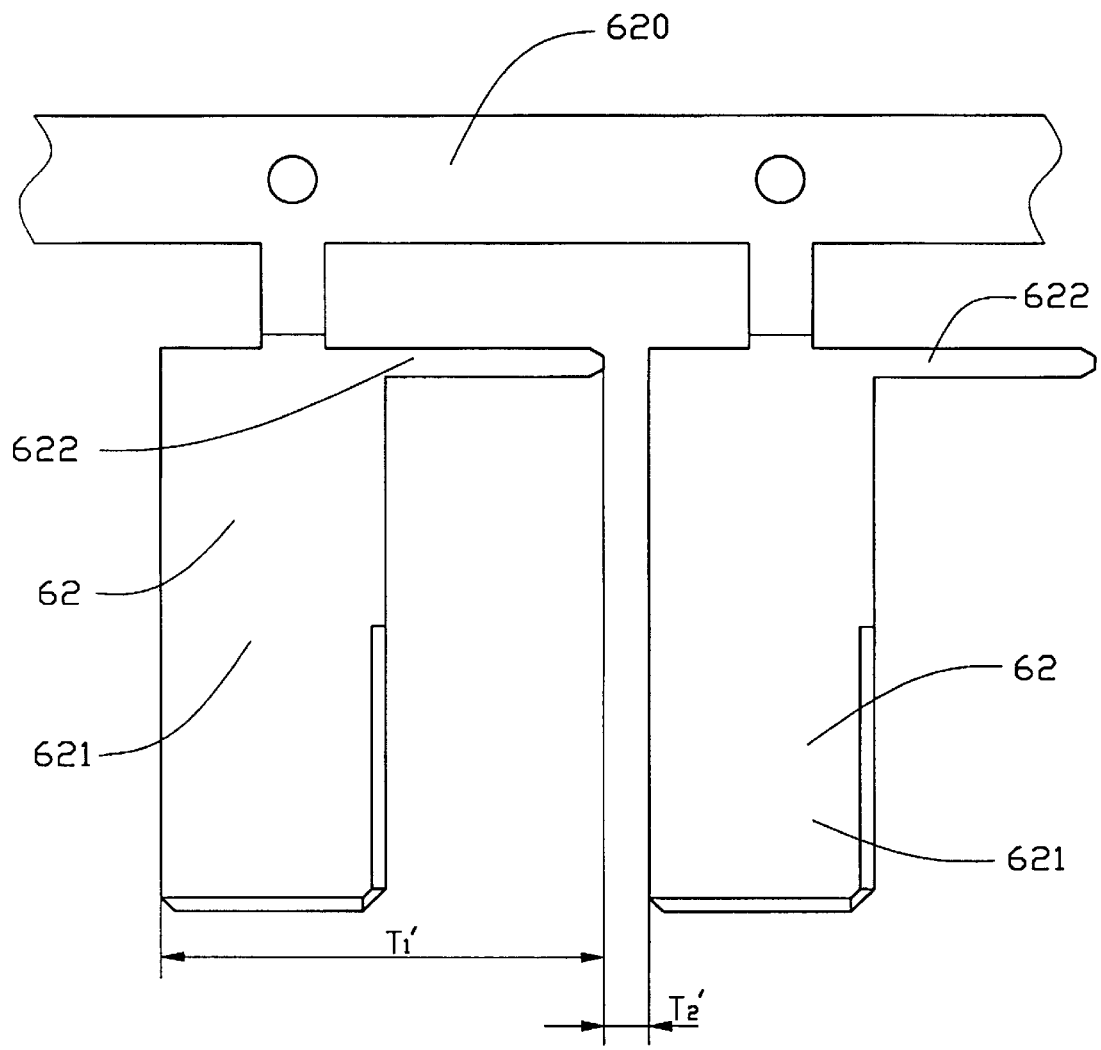
FIG. 2 is a plan view showing terminals of FIG. 1 connected to a carrier strip.

Thus, the connecting portion 122 of each terminal 12 of the present invention has a length T1 longer than the length T1' of the connecting leg 622 of the conventional terminal 62 (FIG. 2). Furthermore, each cutout 123 provides an adjusting distance T2 for allowing further extension of the corresponding connecting portion 122 of the adjacent terminal 12 and for permitting operation of a corresponding punch pin of the die therein. Therefore, the terminals 12 can be stamped and formed without changing a distance between adjacent terminals 12. Thus, the die for stamping the terminals 12 does not require modification, instead only the addition or exchange of several punch pins are required to form the cutout 123 thereby decreasing manufacturing costs.

Figure 5:
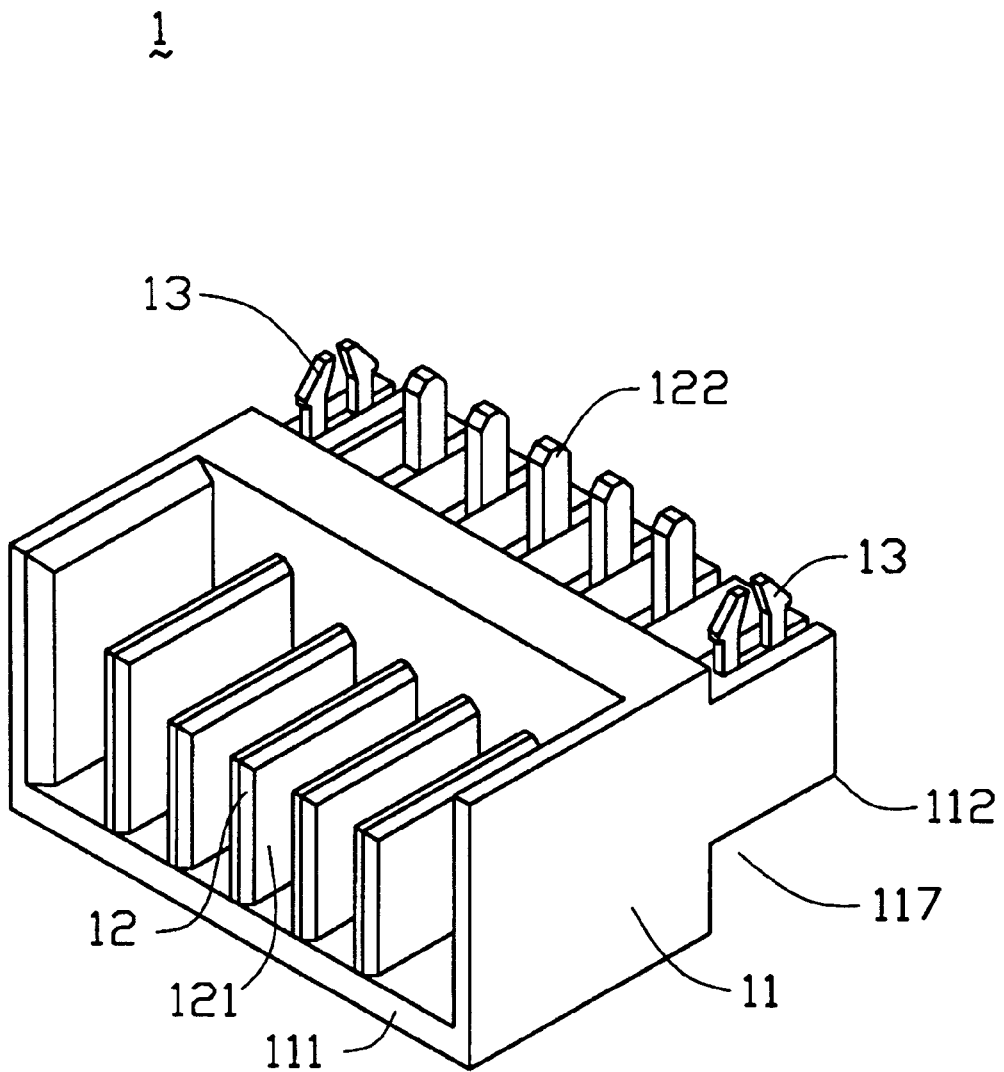
FIG. 5 is an assembled view of FIG. 3.
Figure 6:
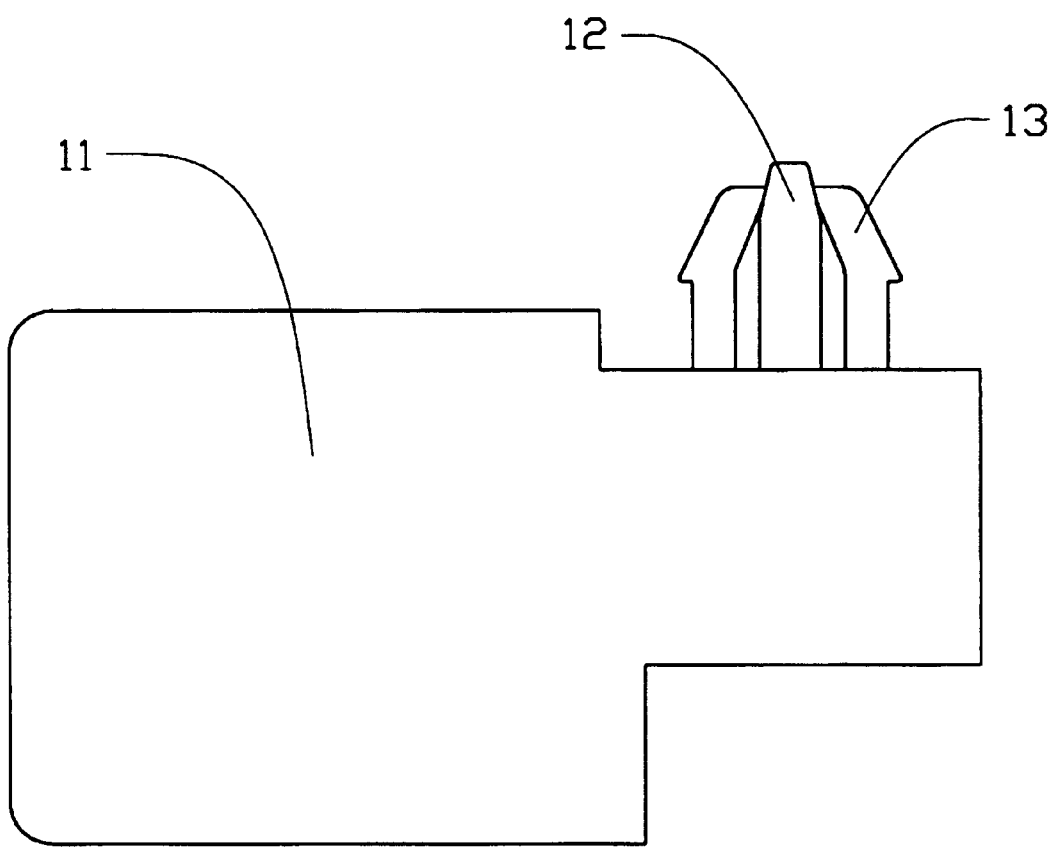
FIG. 6 is a side plan view of FIG. 5.

Referring to FIGS. 5 and 6, in assembly, the carrier strip 120 is separated from the terminals 12 of the subassembly 3. The terminals 12 are then inserted into the corresponding passageways 113 of the housing 11. The connecting legs 122 of the terminals 12 extend beyond the housing 11, while the mating portions 121 extend into the mating chamber 1110 and are parallel to each other for electrically contacting the corresponding battery coils. The retention members 13 are fixed in the corresponding latching slots 114 with the lugs 130 extending beyond the housing 11 for engaging with the corresponding holes 21 of the circuit board 2. The mating portion 111 of the housing 11 may also define a recessed cutout 117 at a corner corresponding to the cutouts 123 of the terminals 12 received therein.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A terminal strip subassembly comprising:

a terminal carrier strip;

a plurality of terminals outwardly extending from the terminal carrier strip and being arranged side by side in a common plane, each terminal comprising a mating portion having a lateral edge, a connecting leg outwardly extending from a free end of the lateral edge portion, and a cutout defined in a corner formed on the other free end of the lateral edge portion opposite the connecting leg and adjacent the carrier strip, the connecting leg of one terminal extending into the cutout of an adjacent terminal.

2. The subassembly as claimed in claim 1, wherein the cutout of each terminal is dimensioned to allow insertion of the connecting portion of an adjacent terminal and insertion of a corresponding punch pin of a die for stamping the subassembly.

3. The subassembly as claimed in claim 1, wherein the cutout of each terminal has a length extending along a first direction parallel to and substantially equal to one third of a width of the mating portion, and a width extending along a second direction perpendicular to the first direction and substantially equal to one ninth of a length of the mating portion.

* * * * *